(12) United States Patent
Dobashi et al.

(10) Patent No.: US 10,356,295 B2
(45) Date of Patent: *Jul. 16, 2019

(54) IMAGING DEVICE, MANUFACTURING DEVICE, AND MANUFACTURING METHOD

(71) Applicant: SONY CORPORATION, Tokyo (JP)

(72) Inventors: Eiichiro Dobashi, Kumamoto (JP); Shuichi Mochinaga, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/113,802

(22) Filed: Aug. 27, 2018

(65) Prior Publication Data

US 2018/0367716 A1 Dec. 20, 2018

Related U.S. Application Data

(63) Continuation of application No. 15/323,941, filed as application No. PCT/JP2015/068963 on Jul. 1, 2015, now Pat. No. 10,091,403.

(30) Foreign Application Priority Data

Jul. 14, 2014 (JP) .................................. 2014-143852

(51) Int. Cl.
*H04N 5/225* (2006.01)
*H01L 27/146* (2006.01)
(Continued)

(52) U.S. Cl.
CPC ........... *H04N 5/2254* (2013.01); *G02B 5/208* (2013.01); *G02B 7/006* (2013.01); *G02B 7/021* (2013.01);
(Continued)

(58) Field of Classification Search
CPC ................ H04N 5/2254; H04N 5/2253; H01L 27/14625; H01L 27/14623
See application file for complete search history.

(56) References Cited

U.S. PATENT DOCUMENTS

2005/0169620 A1* 8/2005 Minamio .......... H01L 27/14618
396/71
2009/0147115 A1* 6/2009 Tanida ............. H01L 27/14618
348/294
(Continued)

FOREIGN PATENT DOCUMENTS

| CN | 101315940 | 12/2008 |
|---|---|---|
| CN | 102738189 | 10/2012 |

OTHER PUBLICATIONS

Official Action (with English translation) for Chinese Patent Application No. 201580027314.3, dated Mar. 5, 2019, 21 pages.

*Primary Examiner* — Ahmed A Berhan
(74) *Attorney, Agent, or Firm* — Sheridan Ross P.C.

(57) ABSTRACT

The present technology relates to an imaging device, a manufacturing device, and a manufacturing method that enable a reliable manufacturing device to be manufactured without an increase in the number of manufacturing steps. A substrate on which an image sensor is mounted, a frame that fixes an infrared cut filter (IRCF), and a unit including a lens are included. The image sensor is sealed by the substrate, the IRCF, and the frame. A vent connected to a space in which the image sensor is sealed is provided in a part of the frame. The vent is blocked by a member that bonds the unit and the frame together. The vent is provided in the frame, in a predetermined shape, and in a vertical direction with respect to a surface to which the member is applied. The present technology can be applied to the imaging device.

20 Claims, 13 Drawing Sheets

(51) Int. Cl.
*G02B 7/02* (2006.01)
*G02B 7/00* (2006.01)
*G03B 17/08* (2006.01)
*G03B 11/00* (2006.01)
*G02B 5/20* (2006.01)

(52) U.S. Cl.
CPC .............. *G03B 11/00* (2013.01); *G03B 17/08* (2013.01); *H01L 27/14618* (2013.01); *H01L 27/14623* (2013.01); *H01L 27/14625* (2013.01); *H01L 27/14685* (2013.01); *H04N 5/2253* (2013.01); *H01L 2924/0002* (2013.01); *H01L 2924/16151* (2013.01); *H01L 2924/16152* (2013.01)

(56) References Cited

U.S. PATENT DOCUMENTS

| | | | |
|---|---|---|---|
| 2010/0149410 A1* | 6/2010 | Matsuzawa | H01L 23/10 348/374 |
| 2011/0149143 A1* | 6/2011 | Tsujino | G02B 3/0031 348/374 |

* cited by examiner

IMAGING DEVICE, MANUFACTURING DEVICE, AND MANUFACTURING METHOD

CROSS REFERENCE TO RELATED APPLICATIONS

This application is a continuation of U.S. patent application Ser. No. 15/323,941, filed Jan. 4, 2017, which is a national stage application under 35 U.S.C. 371 and claims the benefit of PCT Application No. PCT/JP2015/068963 having an international filing date 1 Jul. 2015, which designated the United States, which PCT application claimed the benefit of Japanese Patent Application No. 2014-143852 filed 14 Jul. 2014, the disclosures of which are incorporated herein by reference in their entirety.

TECHNICAL FIELD

The present technology relates to an imaging device, a manufacturing device, and a manufacturing method. More specifically, the present technology relates to the imaging device, the manufacturing device, and the manufacturing method for sealing a vent that is required for manufacture and making a closed state.

BACKGROUND ART

In recent years, a digital camera has been reduced in size, and a mobile phone having a function of the digital camera has been widely used. Accordingly, an imaging device is also required to be reduced in size, and a further improvement in quality is also required. Patent Document 1 discloses that when an imaging device is manufactured, a vent for releasing thermally expanded air is provided, and the vent is blocked after the thermally expanded air is released in order to prevent dust or the like from entering through the vent.

CITATION LIST

Patent Document

Patent Document 1: Japanese Patent Application Laid-Open No. 2007-335507

SUMMARY OF THE INVENTION

Problems to be Solved by the Invention

In manufacturing steps for an imaging device, a vent that connects a space including an image sensor to the outside of the space is provided, whereby thermally expanded air in the space can be released. However, the vent is kept open, dust or the like is likely to enter the space through the vent and, for example, stick onto the image sensor. In this regard, blocking the vent has been proposed in Patent Document 1.

In Patent Document 1, an adhesive is dripped into the vent, whereby the vent is blocked. Therefore, a step for blocking the vent is required independently of other steps. Even though the vent is provided during the manufacturing steps for the imaging device, the vent is required to be capable of being blocked without an increase in the number of manufacturing steps for the imaging device.

The present technology has been made in consideration of these circumstances, and an object thereof is to enable a vent to be blocked without an increase in the number of manufacturing steps for an imaging device.

Solutions to Problems

A first imaging device according to an aspect of the present technology includes: a substrate on which an image sensor is mounted; a frame that fixes an infrared cut filter (IRCF); and a unit including a lens, the image sensor is sealed by the substrate, the IRCF, and the frame, a vent connected to a space in which the image sensor is sealed is provided in a part of the frame, and the vent is blocked by a member that bonds the unit and the frame together.

The vent can be provided in the frame, in a predetermined shape, and in a vertical direction with respect to a surface to which the member is applied.

The vent can have a tapered shape.

The unit can have a leg that is inserted into the member, and the vent can be provided on the frame corresponding to a position right under the leg.

The member can be annularly applied onto the frame, and the vent can be provided on the frame corresponding to a bent portion or a straight portion of the member.

The frame can have a light shielding wall in the vicinity of a position of the vent.

The member can be a light shielding resin.

The leg can be inserted halfway into the vent.

A portion of the frame at which the vent is located can be configured to have a projecting shape so as to come closer to the unit than a portion at which the vent is not located does.

A portion of the leg that is inserted into the member at which the vent, is located can have a rib, and the unit can be bonded to the frame in an abutting manner such that the rib is inserted into the vent.

A central axis of the leg and a central axis of the vent can be displaced from each other.

The member can include an ultraviolet curable resin or a resin that is cured by ultraviolet rays and heat.

The vent can have a diameter of 0.2 mm or less.

The vent can be blocked by the leg.

A second imaging device according to an aspect of the present technology includes: a substrate on which an image sensor is mounted; a frame that fixes an infrared cut filter (IRCF); and a unit including a lens, the image sensor is sealed by the substrate, the IRCF, and the frame, a vent connected to a space in which the image sensor is sealed is provided between the frame and the IRCF, and the vent is blocked by a member that bonds the unit and the frame together.

The IRCF can be configured to be large in a direction toward a position of the vent.

The member at a portion where the vent exists can be applied more than the member at a portion where the vent does not exist.

A first manufacturing device according to an aspect of the present technology manufactures an imaging device including: a substrate on which an image sensor is mounted; a frame that fixes an infrared cut filter (IRCF); and a unit bonded to the frame and including a lens, the image sensor is sealed by the substrate, the IRCF, and the frame, a vent connected to a space in which the image sensor is sealed is provided in a part of the frame, and the vent is blocked by a member that bonds the unit and the frame together.

A second manufacturing device according to an aspect of the present technology is configured to, when a substrate on which an image sensor is mounted, a frame to which an infrared cut, filter (IRCF) is fixed, and a unit including a lens are bonded together: apply, onto the substrate, a first member for bonding the frame; bond the frame to the substrate using the first member applied onto the substrate; after thermally expanded air is discharged through a vent having a predetermined shape and provided in the frame, apply a second member to a portion including the vent; and bond the frame and the unit together such that the portion to which the second member has been applied and a part of the unit are bonded together in an abutting manner or spatially.

A manufacturing method according to an aspect of the present technology includes the steps of, when a substrate on which an image sensor is mounted, a frame to which an infrared cut filter (IRCF) is fixed, and a unit including a lens are bonded together: applying, onto the substrate, a first member for bonding the frame; bonding the frame to the substrate using the first member applied onto the substrate; after thermally expanded air is discharged through a vent having a predetermined shape and provided in the frame, applying a second member to a portion including the vent; and bonding the frame and the unit together such that the portion to which the second member has been applied and a part of the unit are bonded together in an abutting manner or spatially.

In the first imaging device according to an aspect of the present technology, the substrate on which the image sensor is mounted, the frame that fixes the infrared cut filter (IRCF), and the unit including the lens are included. In addition, the image sensor is sealed by the substrate, the IRCF, and the frame, the vent connected to the space in which the image sensor is sealed is provided in a part of the frame, and the vent is blocked by the member that bonds the unit and the frame together.

In the second imaging device according to an aspect of the present technology, the substrate on which the image sensor is mounted, the frame that fixes the infrared cut filter (IRCF), and the unit including the lens are included. In addition, the image sensor is sealed by the substrate, the IRCF, and the frame, the vent connected to the space in which the image sensor is sealed is provided between the frame and the IRCF, and the vent is blocked by the member that bonds the unit and the frame together.

In the first manufacturing device and the manufacturing method according to an aspect of the present technology, the first imaging device is manufactured.

In the second manufacturing device according to an aspect of the present technology, when the substrate on which the image sensor is mounted, the frame to which the infrared cut filter (IRCF) is fixed, and the unit including the lens are bonded together: the first member for bonding the frame is applied onto the substrate; the frame is bonded to the substrate using the first member applied onto the substrate; after thermally expanded air is discharged through the vent having a predetermined shape and provided in the frame, the second member is applied to a portion including the vent; and the frame and the unit are bonded together such that the portion to which the second member has been applied and a part of the unit are bonded together.

Effects of the Invention

According to an aspect of the present technology, a vent can be blocked without an increase in the number of manufacturing steps for an imaging device.

Note that the effects described herein are not necessarily limited, and any of effects described in the present disclosure may be obtained.

MODE FOR CARRYING OUT THE INVENTION

Hereinafter, a mode for carrying out the present technology (hereinafter referred to as an "embodiment") will be described. Note that the description will be provided in the following order:

1. Configuration of Imaging Device
2. Configuration of First Imaging Device for Which Reduced Number of Steps Are Used
3. Configuration of Second Imaging Device for Which Reduced Number of Steps Are Used
4. Configuration of Third imaging Device for Which Reduced Number of Steps Are Used
5. Regarding Position at Which Vent Is Provided
6. Regarding Shape of Vent
7. Regarding Configuration in Which Light Shielding Wall Is Provided
8. Regarding Shape of Leg
9. Regarding Manufacture
10. Electronic Apparatus <Configuration of Imaging Device>

The present technology can be applied to a camera module including an image sensor and configured to perform a focus adjustment or a camera module that does not perform the focus adjustment. In addition, the camera module to which the present technology is applied is characterized in that steps for manufacture can be reduced as compared with a conventional camera module. In order to clearly explain that the steps for the manufacture can be reduced as compared with the conventional camera module, the conventional camera module (imaging device) will be described first.

Figure 1:
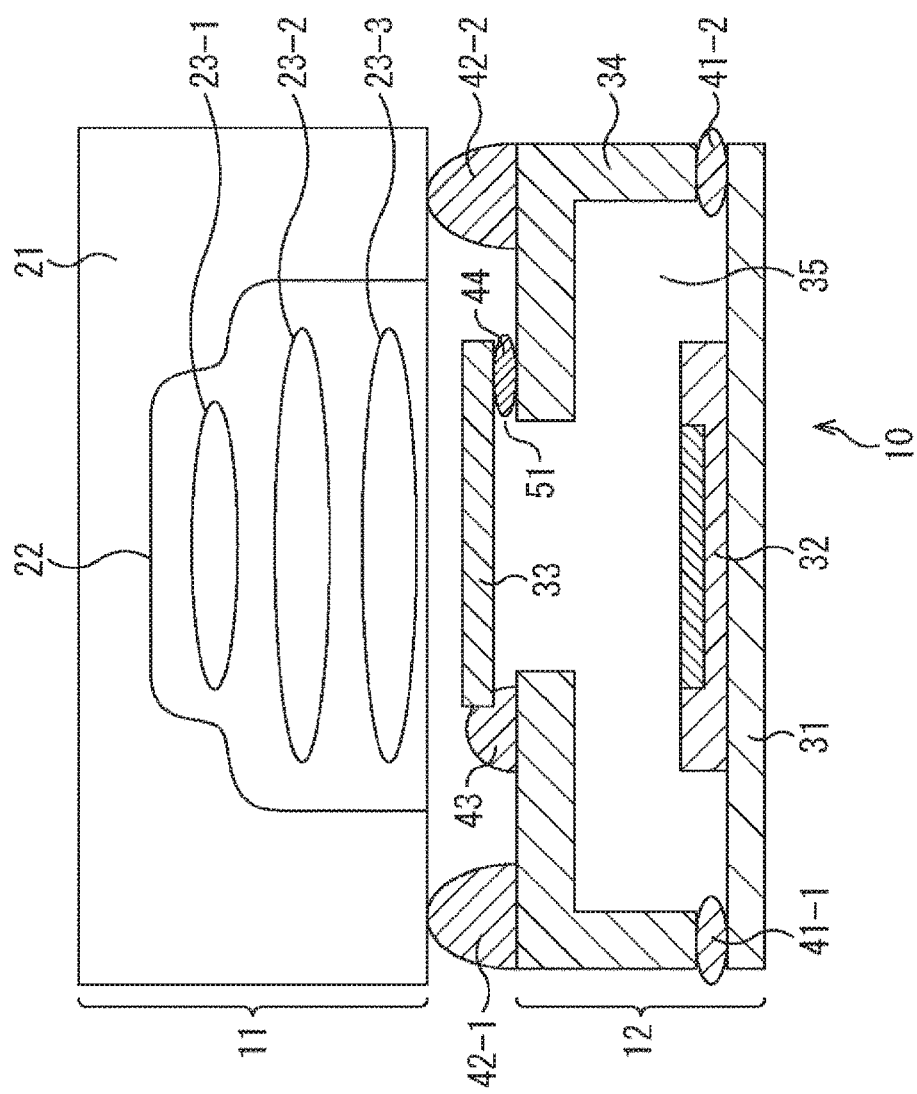
FIG. 1 is a diagram illustrating a configuration of an imaging device.

FIG. 1 is a cross-sectional diagram illustrating a configuration of the imaging device. The imaging device 10 illustrated in FIG. 1 includes an upper part 11 and a lower part 12. Hereinafter, the description will be provided on the assumption that the upper part 11 and the lower part 12 constitute the imaging device 10 for convenience of the description.

The upper part 11 includes an actuator 21, a lens barrel 22, and a lens 23. The lower part 12 includes a substrate 31, an image sensor 32, an infrared cut filter (IRCF) 33, and a frame 34.

Three lenses, i.e., a lens 23-1, a lens 23-2, and a lens 23-3, are incorporated inside the lens barrel 22, and the lens barrel 22 is configured to hold these lenses 23-1 to 23-3. The lens barrel 22 is contained in the actuator 21, and the actuator 21 is attached onto an upper part of the lower part 12. Note that the description will be continued using the example in which the three lenses are incorporated in the lens barrel 22. However, a different number of lenses, e.g., three or more lenses, may be incorporated.

For example, an outer side surface of the lens barrel 22 is provided with a screw (not illustrated), and a portion of the inside of the actuator 21 is provided with a screw (not illustrated) at a position that is screwed with the screw of the lens barrel 22. The screw of the lens barrel 22 and the screw on the inside of the actuator 21 are configured to be screwed with each other.

In a case where the lens barrel 22 is configured to be movable in an up-down direction in the drawing to make a configuration for enabling auto-focus (AF), a coil is provided, for example, on the side surface of the lens barrel 22 (lens holder to which the lens barrel 22 is attached). In addition, a magnet is provided inside the actuator 21 at a position facing the coil. The magnet is provided with a yoke. The coil, the magnet, and the yoke constitute a voice coil motor.

When a current flows in the coil, force is generated in the up-down direction in the drawing. The generated force causes the lens barrel 22 to move in an upward direction or a downward direction. Due to the movement of the lens barrel 22, a distance between the lenses 23-1 to 23-3 held by the lens barrel. 22 and the image sensor 32 is changed. Owing to such a mechanism, the auto-focus can be realized.

Note that, in the following description, the description will be continued on the assumption that the actuator 21 is included in the upper part 11. However, a configuration that does not include the actuator 21 can also be employed. The upper part 11 is a portion that is referred to as a lens unit or the like. In the following description, the upper part 11 is illustrated by a quadrilateral, and the illustration of the lens 23 or the like is appropriately omitted.

The image sensor 32 is provided in a central part of the lower part 12. The image sensor 32 is attached onto the substrate 34, and coupled to the substrate 34 by wiring (not illustrated). Onto a surface of the substrate 31 on which the image sensor 32 is provided, the frame 34 attached. The frame 34 has a function of holding the IRCF 33. In addition, on a side of the frame 34 opposite to a side that is in contact with the substrate 31, the upper part 11 is provided, In order to prevent a foreign substance such as dust from entering a space 35 surrounded by the substrate 31, the IRCF 33, and the frame 34, the substrate 31, the IRCF 33, and the frame 34 adhere to one another so that no gap exists therebetween. The space 35 becomes a substantially closed space by means of the substrate 31, the IRCF 33, and the frame 3-1.

Consequently, the space 35 is configured to prevent a foreign substance from being introduced thereinto. The IRCF 33 functions as a filter that cuts infrared, and is also used for sealing the image sensor 32 in the space 35.

When the imaging device 10 is manufactured, the frame 34 is bonded onto the substrate 31 using an adhesive 41-1 and an adhesive 41-2. A portion of the frame 34 that is in contact with the substrate 31 has a predetermined shape, e.g., a continuous shape such as a quadrilateral, and the adhesive 41 is applied to the continuous portion. Therefore, as illustrated in FIG. 1, although the adhesive 41-1 and the adhesive 41-2 are represented as different, and separate adhesives in the cross-sectional diagram, the adhesive 41-1 and the adhesive 41-2 are formed so as to form a single annular adhesive layer, and continuously applied to the portion of the frame 34 that is in contact with the substrate 31.

In a similar manner, the frame 34 and the upper part 11 are bonded together using an adhesive 42-1 and an adhesive 42-2.

The IRCF 33 is bonded to the frame 34 using an adhesive 43 and an adhesive 44. The adhesive 43 and the adhesive 44 are adhesives that are applied separately at different timings.

The adhesive 44 is applied at the time of the manufacture to block a vent 51 for releasing thermally expanded air to the outside, and to bond the IRCF 33 to the frame 34.

Figure 2:
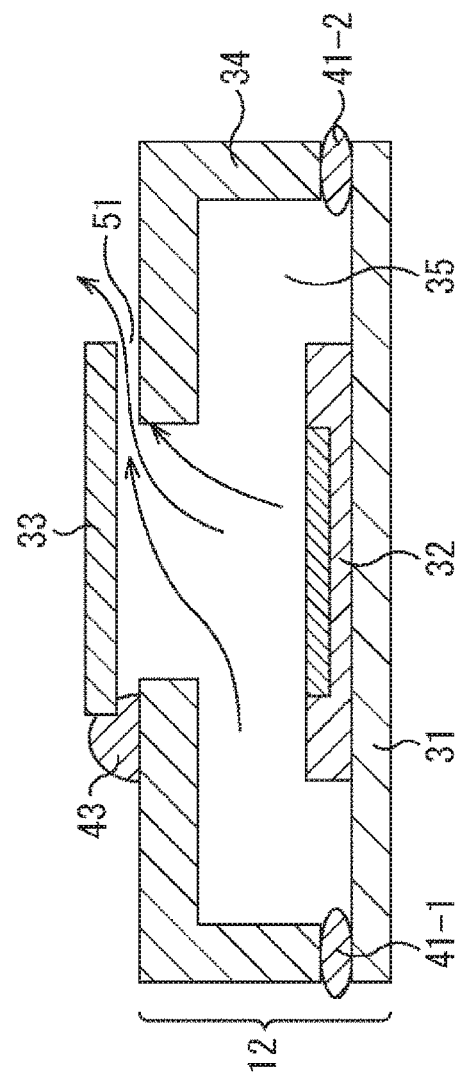
FIG. 2 is a diagram for explaining a step in manufacturing steps for the imaging device.

A configuration of the imaging device 10 during the manufacture is illustrated in FIG. 2. The imaging device 10 illustrated in FIG. 2 is in a process of manufacturing the lower part 12, and the lower part 12 to which the upper part 11 is not bonded is illustrated. The IRCF 33 is bonded to the frame 34 using the adhesive 43, a part of which is provided with the vent 51.

When the substrate 31 and the frame 34 are bonded together using the adhesive 41-1 and the adhesive 41-2, air in the space 35 is thermally expanded. The vent 51 is provided in order to release the thermally expanded air. As illustrated by arrows in FIG. 2, through the vent 51, the thermally expanded air in the space 35 is discharged through the vent 51 at the outside of the space 35.

After the substrate 31 and the frame 34 are bonded together, and the thermally expanded air is discharged from the space 35, the vent 51 is blocked by the adhesive 44. If the vent 51 is kept open, a foreign substance such as dust is likely to enter the space 35 and stick to the image sensor 32. In other words, if the vent 51 is kept open, generation of a black spot defect might be caused.

Therefore, the vent 51 is blocked after the substrate 31 and the frame 34 are bonded together. Consequently, the image sensor 32 is sealed by the substrate 31, the IRCF 33, and the frame 34, and the substantially closed space 35 can be produced.

After the vent 51 is blocked, the upper part 11 is bonded to the lower part 12 using the adhesive 42-1 and the adhesive 42-2.

As described above, although the vent 51 needs to be provided, the step of blocking the vent 51 is required since the vent 51 is provided, and the step of bonding the upper part 11 to the lower part 12 needs to be performed after the step of blocking the vent 51.

<Configuration of First Imaging Device for which Reduced Number of Steps are Used>

Figure 3:
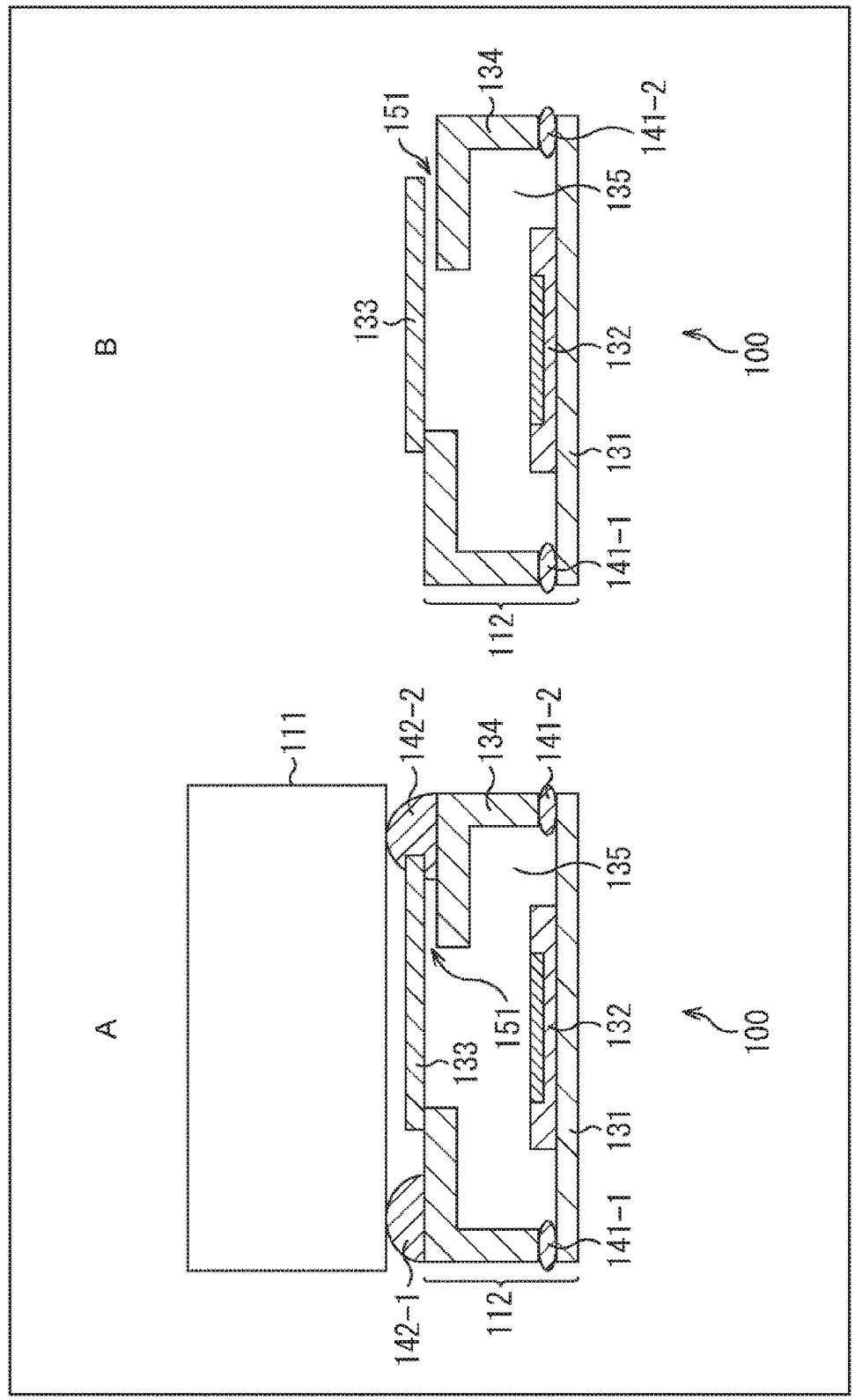
FIG. 3 is a diagram for explaining a configuration of an imaging device for which a small number of manufacturing steps are used.

Next, an imaging device for which a small number of steps are used in the manufacture of the imaging device will be described. A of FIG. 3 and B of FIG. 3 are diagrams illustrating a configuration of a first embodiment of the imaging device for which a small number of steps are used. A of FIG. 3 is a diagram illustrating the configuration of the imaging device 100 after the manufacture, and B of FIG. 3 is a diagram illustrating a state of the imaging device 100 during the manufacture.

The imaging device 100 illustrated in A of FIG. 3 includes an upper part 111 and a lower part 112. In FIG. 3 as well, the description will be provided on the assumption that the upper part 111 and the lower part 112 constitute the imaging device 100 for convenience of the description.

The upper part 111 can be configured in a manner similar to that of the upper part 11 illustrated in FIG. 1. Specifically, the upper part 111 can be configured to include the actuator, the lens barrel, and the lens. In the following description, the description of the upper part 111 is omitted on the assumption that the upper part 111 has the same configuration as the upper part 11. In addition, the present technology to be described later can be applied to the imaging device configured in such a manner that a unit including the lens is regarded as the upper part 111, and the upper part 111 is bonded to the lower part 112.

An image sensor 132 is provided in a central part of the lower part 112. The image sensor 132 is attached onto a substrate 131, and coupled to the substrate 131 by wiring (not illustrated). Onto a surface of the substrate 131 on which the image sensor 132 is provided, a frame 134 is attached. The frame 134 has a function of holding an IRCF 133. In addition, on a side of the frame 134 opposite to a side that is in contact with the substrate 131, the upper part 111 is provided.

In order to prevent a foreign substance such as dust from entering a space 135 surrounded by the substrate 131, the IRCF 133, and the frame 134, the substrate 131, the IRCF 133, and the frame 134 adhere to one another so that no gap exists therebetween. The space 135 becomes a substantially closed space by means of the substrate 131, the IRCF 133, and the frame 134.

The imaging device 100 having the space 135 that is the substantially closed space as illustrated in A of FIG. 3 is provided with a vent for releasing thermally expanded air during the manufacture. The configuration of the imaging device 100 during the manufacture is illustrated in B of FIG. 3.

The IRCF 133 is bonded to the frame 134. In the same way as the imaging device 10 illustrated in FIGS. 1 and 2, the frame 134 and the IRCF 133 are bonded together using a bonding material such as an adhesive.

A part of the portion at which the frame 134 and the IRCF 133 are bonded together is provided with a vent 151 connected to the space 135. The vent 151 can be configured using a gap between the frame 134 and the IRCF 133.

Since the vent 151 is provided, when the substrate 131 and the frame 134 are bonded together using an adhesive 141-1 and an adhesive 141-2, thermally expanded air in the space 135 can be discharged to the outside of the space 135. In a case where a thermosetting resin is used as the adhesive 141, air in the space 135 is thermally expanded when the thermosetting resin is cured. Therefore, the vent 151 is required for discharging the thermally expanded air.

Note that the adhesive 141 is also annularly applied onto the frame 134 in the same way as described with reference to FIGS. 1 and 2, and each of the adhesive 141-1 and the adhesive 141-2 is an adhesive constituting a portion of an annularly-formed adhesive layer.

After the substrate 131 and the frame 134 are bonded together, and the thermally expanded air is discharged from the space 135 to some extent, the upper part 111 is bonded to the lower part 112 using the adhesive 141-1 and the adhesive 141-2.

In the imaging device 100 illustrated in FIG. 3, the vent 151 is blocked by the adhesive 141-2 that is applied when the upper part 111 is bonded to the lower part 112. In this manner, in order to make sure that the vent 151 is blocked when the upper part 111 is bonded to the lower part 112, the IRCF 133 is configured to be longer (larger) than the IRCF 33 illustrated in FIG. 2.

The IRCF 133 illustrated in B of FIG. 3 is formed to be relatively large so that a large portion of the IRCF 133 overlaps the frame 134 on a side provided with the vent 151. Only a portion of the IRCF 133 that is located above the vent 151 may be configured to be larger than the other portion (shape having a projecting part when viewed from above), or the entire IRCF 133 may have a large shape. For example, in a case where the IRCF 33 illustrated in FIG. 2 has a square shape when viewed from above, the IRCF 133 illustrated in FIG. 3 may be configured to have a rectangular shape so that a large portion of the IRCF 133 overlaps the frame 134.

As described above, since the IRCF 133 is configured to be larger than the conventional IRCF 33, the vent 151 can be blocked by the adhesive 142-2 that is applied when the upper part 111 is bonded to the lower part 112.

As illustrated in A of FIG. 3, even when the adhesive 142-2 (B of FIG. 3) is applied at the same position as the adhesive 42-2 in FIG. 1 by the same amount (size), since the IRCF 133 is configured to be large, the IRCF 133 is located so as to reach the position for the application. Therefore, the adhesive 142-2 can be applied at least to a distal end portion of the IRCF 133. As a result, the vent 151 is blocked by the adhesive 142-2.

As described above, the IRCF 133 is configured to be large, whereby the vent 151 can be blocked in the step of bonding the upper part 111 to the lower part 112. In other words, the step for blocking the vent 151 can be omitted.

<Configuration of Second Imaging Device for which Reduced Number of Steps are Used>

Figure 4:
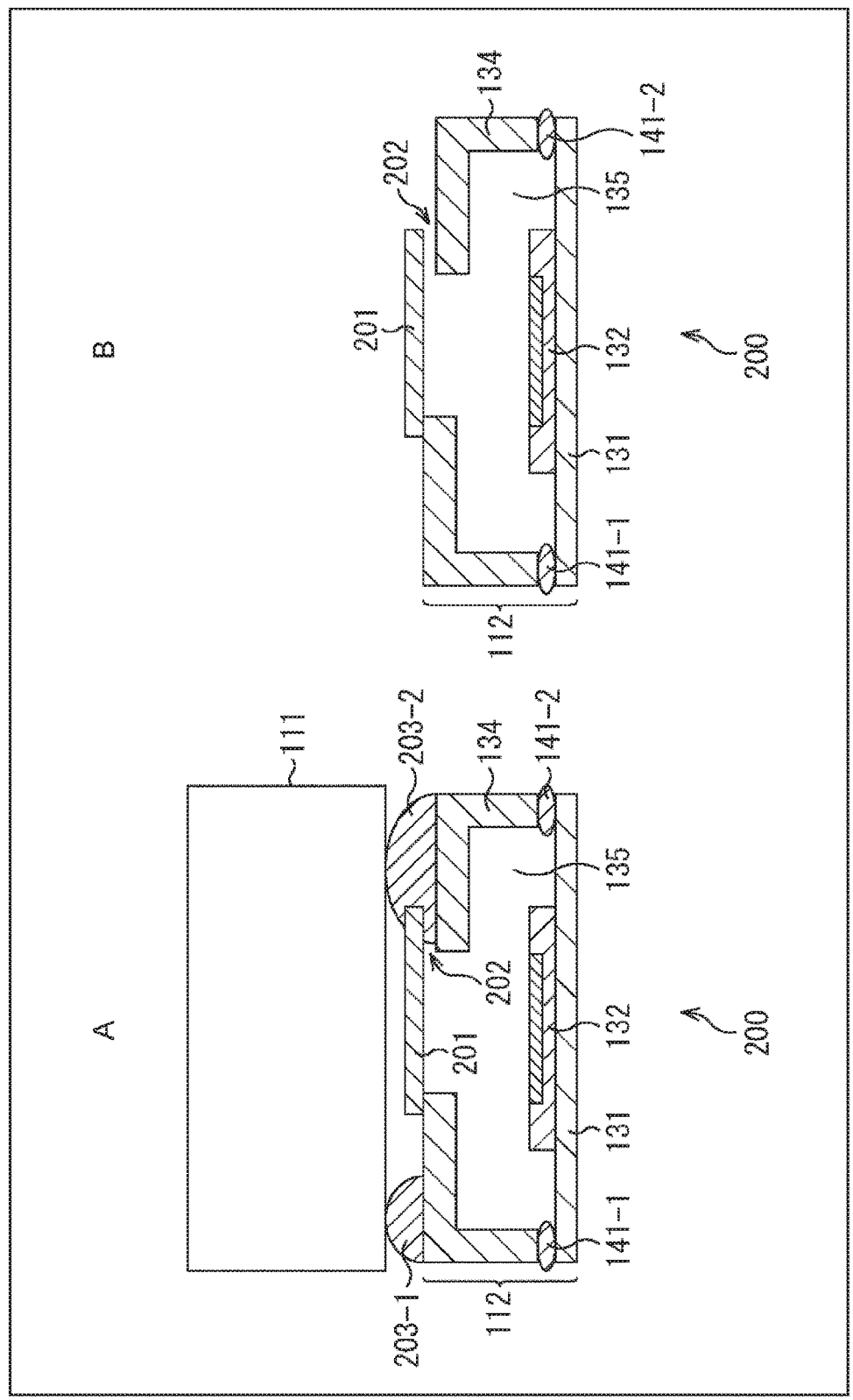
FIG. 4 is a diagram for explaining a configuration of an imaging device for which a small number of manufacturing steps are used.

Next, another configuration of an imaging device for which a small number of steps are used in the manufacture of the imaging device will be described. A of FIG. 4 and B of FIG. 4 are diagrams illustrating a configuration of a second embodiment of the imaging device for which a small number of steps are used. A of FIG. 4 is a diagram illustrating the configuration of the imaging device 200 after the manufacture, and B of FIG. 4 is a diagram illustrating a state of the imaging device 200 during the manufacture.

Since the imaging device 200 illustrated in FIG. 4 has the same basic configuration as the imaging device 100 illustrated in FIG. 3, a similar portion is denoted by a similar reference sign, and the description thereof is omitted.

As compared with the imaging device 100 illustrated in A of FIG. 3, the imaging device 200 illustrated in A of FIG. 4 is different in size of an IRCF and size (application amount) of an adhesive that blocks a vent.

An IRCF 201 of the imaging device 200 illustrated in A of FIG. 4 is configured to be smaller than the IRCF 133 of the imaging device 100 illustrated in A of FIG. 3. For example, the IRCF 201 can have the same size as the IRCF 33 of the imaging device 10 illustrated in FIG. 1. In other words, since the conventional IRCF 33 can be used as the IRCF 201 in the imaging device 200, an IRCF having a new size does not need to be manufactured.

An adhesive 203-2 for the imaging device 200 illustrated in A of FIG. 4 is configured to be larger than the adhesive 142-2 for the imaging device 100 illustrated in A of FIG. 3 and the adhesive 42-2 for the imaging device 10 illustrated in FIG. 1. The adhesive 203-2 is configured to have such a size and application amount as to cover a part of the IRCF 201.

As illustrated in B of FIG. 4, in the process of manufacturing the imaging device 200, when the frame 134 is bonded to the substrate 131, a vent 202 for releasing thermally expanded air in the space 135 to the outside of the space 135 is provided. The vent 202 is blocked by the adhesive 203-2 that is applied when the upper part 111 is bonded to the lower part 112.

In this manner, in order to make sure that the vent 202 is blocked by the adhesive 203-2 when the upper part 111 is bonded to the lower part 112, for example, the application amount of the adhesive 203-2 at a portion where the vent 202 is located is more than the application amount at the other portion. Alternatively, a region for the application is expanded to reach the portion where the vent 202 is located as compared with the other portion.

In this manner, the application amount is increased, or a track for the application is extended, whereby the adhesive 203-2 is configured to be large. Consequently, the vent 202 can be blocked by the adhesive 203-2 when the upper part 111 is bonded to the lower part 112.

As described above, the adhesive 203 at the portion where the vent 202 is located is configured to be larger than that at the other portion, whereby the vent 202 can be blocked in the step of bonding the upper part 111 to the lower part 112. In other words, the step for blocking the vent 202 can be omitted.

<Configuration of Third Imaging Device for which. Reduced Number of Steps are Used>

Figure 5:
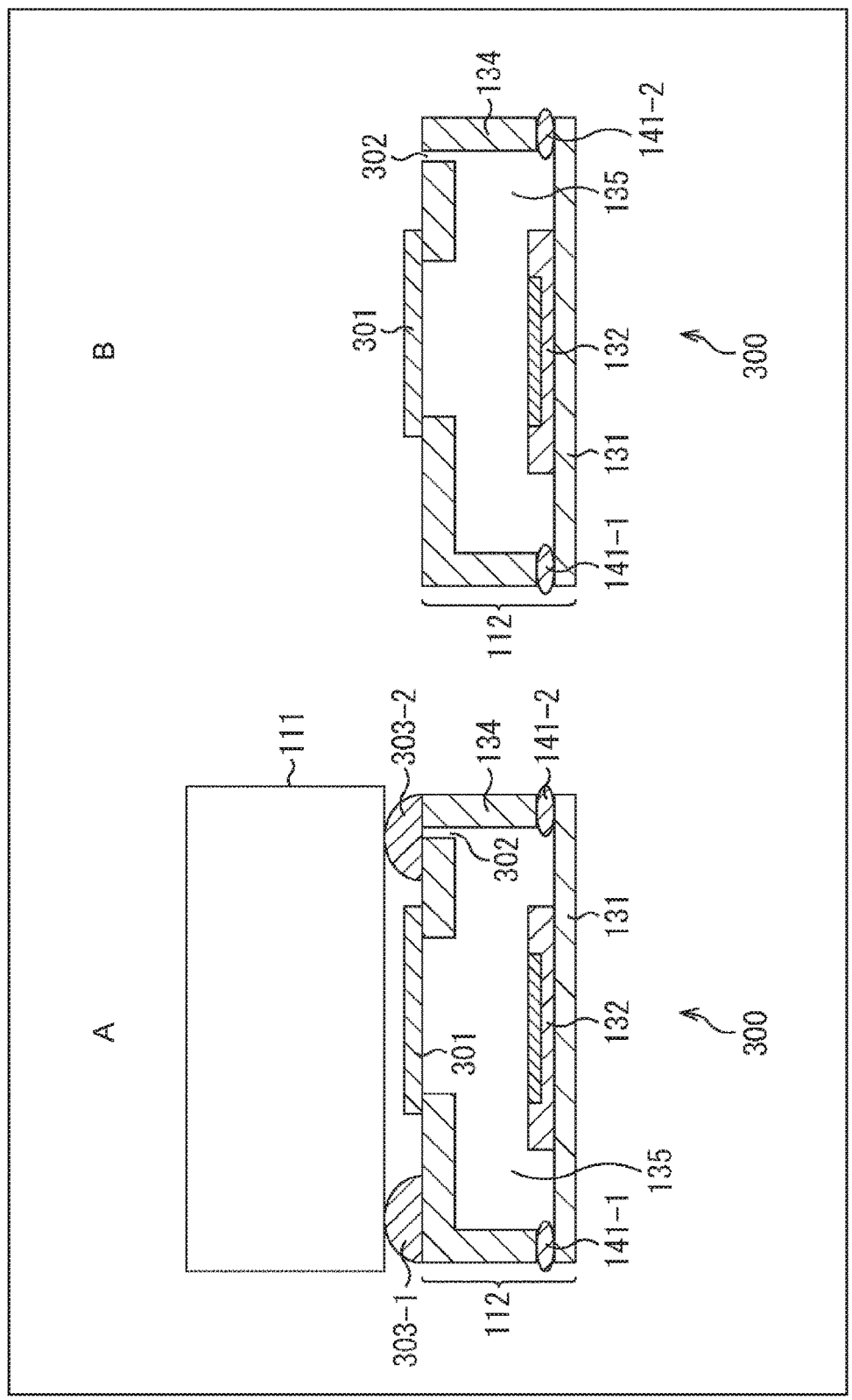
FIG. 5 is a diagram for explaining a configuration of an imaging device for which a small number of manufacturing steps are used.

Next, another configuration of an imaging device for which a small number of steps are used in the manufacture of the imaging device will be described. A of FIG. 5 and B of FIG. 5 are diagrams illustrating a configuration of a third embodiment of the imaging device for which a small number of steps are used. A of FIG. 5 is a diagram illustrating the configuration of the imaging device 300 after the manufacture, and B of FIG. 5 is a diagram illustrating a state of the imaging device 300 during the manufacture.

Since a portion of the imaging device 300 illustrated in FIG. 5 has the same configuration as that of the imaging device 100 illustrated in FIG. 3 and that of the imaging device 200 illustrated in FIG. 4, a similar portion is denoted by a similar reference sign, and the description thereof is omitted.

A position of a vent of the imaging device 300 illustrated in FIG. 5 is different from that of the imaging device 100 illustrated in FIG. 3 and that of the imaging device 200 illustrated in FIG. 4. Referring to A of FIG. 5, an IRCF 301 of the imaging device 300 can have the same size as, for example, the IRCF 33 of the imaging device 10 illustrated in FIG. 1 in the same way as the IRCF 201 of the imaging device 200 illustrated in FIG. 4. In other words, since the conventional IRCF 33 can be used as the IRCF 301 in the imaging device 300, an IRCF having a new size does not need to be manufactured.

In addition, in the imaging device 300 illustrated in FIG. 5, an adhesive 303-2 for bonding the upper part 111 and the lower part 112 together can have a size equivalent to that of the adhesive 42-2 for bonding the upper part 11 and the lower part 12 together in the imaging device 10 illustrated in FIG. 1. In the imaging device 300 illustrated in FIG. 5, the vent is configured to be capable of being blocked even without the increase in the application amount of the adhesive 303 or the expansion of the application region.

As illustrated in B of FIG. 5, the vent 302 of the imaging device 300 is provided in a portion of the frame 134 so as to be connected to the space 135 in a vertical direction (longitudinal direction) with respect to a surface of the frame 134 to which the adhesive 303 is applied. A position at which the vent 302 is provided is a portion to which the adhesive 303-2 is applied. In other words, assuming that when the upper part 111 is bonded to the lower part 112, the adhesive 303 is applied at the same position and by the same amount as in the portion to which the adhesive 42 for the imaging device 10 illustrated in FIG. 1 is applied, the vent 302 is provided in a portion of a region for the application.

As illustrated in B of FIG. 5, in the process of manufacturing the imaging device 300, when the frame 134 is bonded to the substrate 131, the vent 302 for releasing thermally expanded air in the space 135 to the outside of the space 135 is provided. The vent 302 as blocked by the adhesive 303-2 that is applied when the upper part 111 is bonded to the lower part 112. Note that although the description is provided using the adhesive 303 as an example, any member that bonds the upper part 111 and the lower part 112 together may be employed.

As described above, the vent 302 is provided in the frame 134 in the longitudinal direction and provided at a position that is blocked by the adhesive 303-2 when the upper part 111 bonded to the lower part 112, whereby the vent 302 can be blocked in the step of bonding the upper part 111 to the lower part 112. In other words, the step for blocking the vent 302 can be omitted.

In the following description, the description will be continued using the imaging device 300 provided with the vent 302 as an example.

Figure 6:
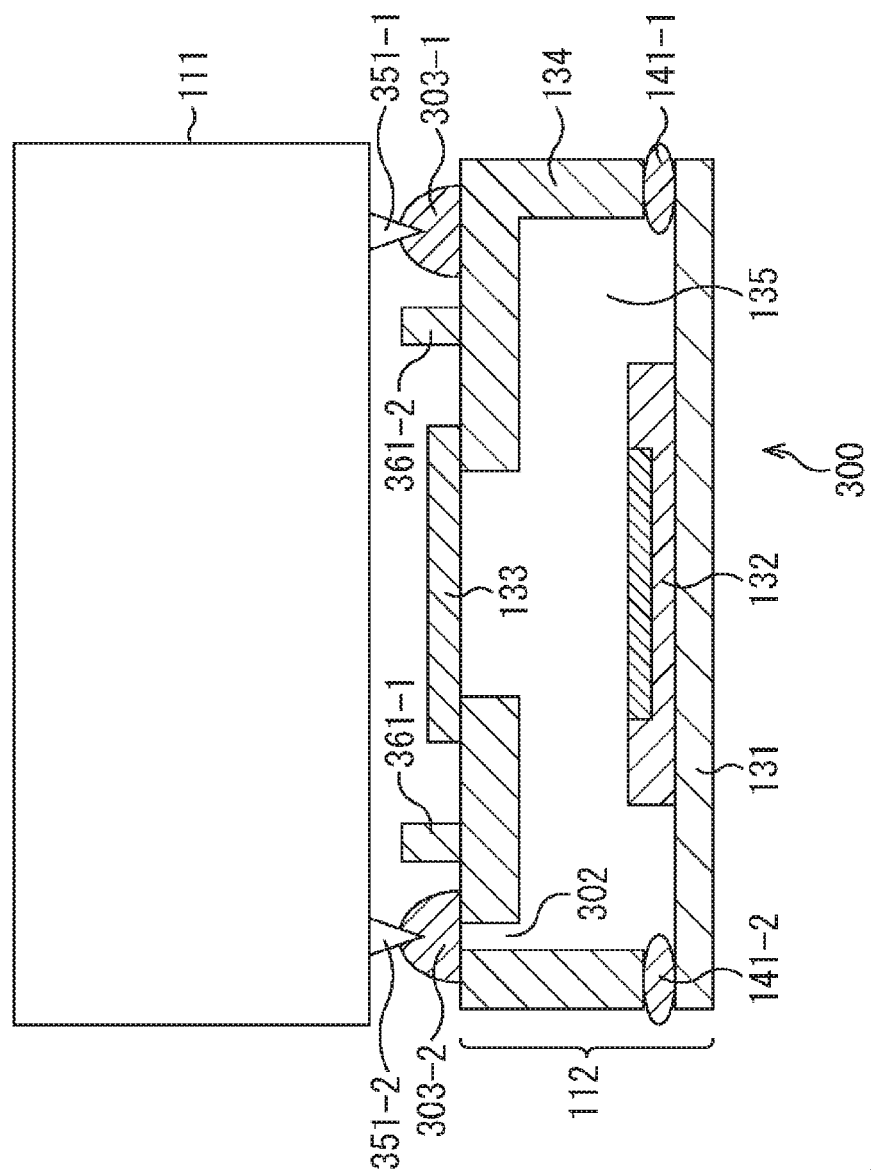
FIG. 6 is a diagram for explaining a configuration of the imaging device for which a small number of manufacturing steps are used.

FIG. 6 is a diagram illustrating another configuration of the imaging device 300. In the imaging device 300, the upper part 111 is provided with a leg 351. As used herein, the leg is a portion having a projecting shape and provided at a portion of the upper part 111 that is bonded to the lower part 112.

The leg 351 is, for example, a projecting part having a triangular cross-section as illustrated in FIG. 6. The leg enters the adhesive 303, whereby the upper part 111 and the lower part 112 are bonded together. The vent 302 is provided in the frame 134 so that the vent 302 is positioned right under the leg 351.

As compared with the imaging device 300 illustrated in A of FIG. 5 in which the upper part 111 and the lower part 112 are bonded together in the absence of the leg 351, the imaging device 300 illustrated in FIG. 6 in which the upper part 111 and the lower part 112 are bonded together in the presence of the leg 351 can increase an area that is bonded to the adhesive 303, whereby the upper part 111 and the lower part 112 can be bonded together more strongly.

In the imaging device 300 illustrated in FIG. 6, a light shielding wall 361 is provided on a side of the frame 134 close to the upper part 111. Since the light shielding wall 361 provided, the image sensor 132 can be shielded from a stray light component that enters the image sensor 132. Therefore, image quality can be improved. In addition, since the light shielding wall 361 is provided, the adhesive 303 can be prevented from leaking out to a side close to the IRCF 301.

As illustrated in FIG. 6, the present technology can also be applied to the imaging device 300 including the leg 351 and the light shielding wall 361. In the following description, using the imaging device 300 illustrated in FIG. 6 as an example, shapes of the vent 302 and the leg 351 and how to apply the adhesive 303 or the like will be described.

<Regarding Position at which Vent is Provided>

Figure 7:
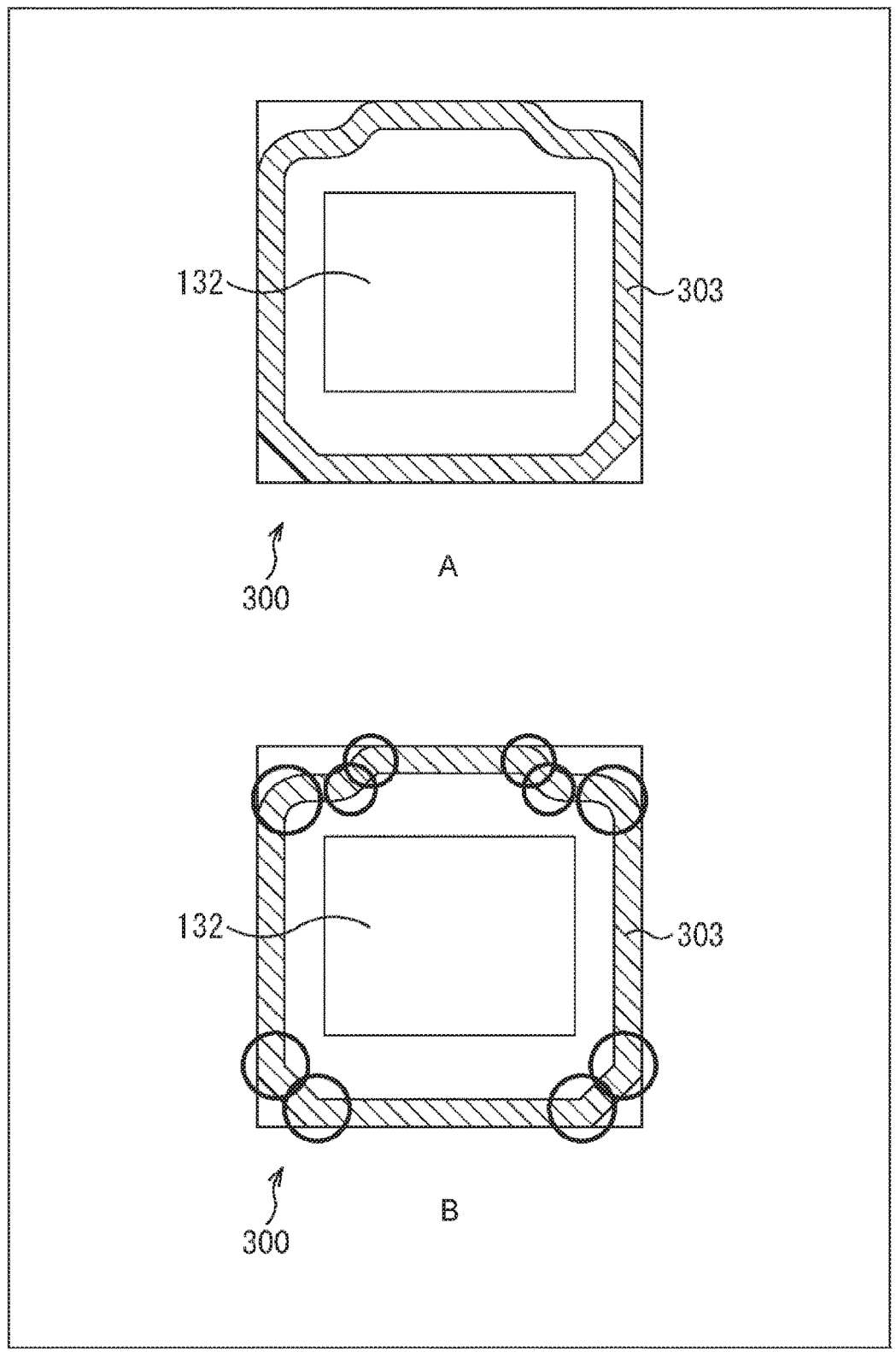
FIG. 7 is a diagram for explaining a position at which a vent is provided.

A of FIG. 7 is a diagram of the imaging device 300 viewed from above. As illustrated in A of FIG. 7, the adhesive 303 is applied onto the frame 134 so as to surround the image sensor 132. The leg 351 provided on the upper part 111 is bonded to the portion subjected to the application of the adhesive 303.

As illustrated in A of FIG. 7, the adhesive 303 is continuously applied without any break. The leg 351 provided on the upper part 111 is configured to have a predetermined shape such as a triangle when viewed in the cross-section as illustrated in FIG. 6, but provided in a continuous annular shape when viewed from above.

As illustrated in A of FIG. 7, although the adhesive 303 may be shaped into a circle or the like, since the image sensor 132 has a quadrilateral shape, the adhesive 303 is formed in a substantially quadrilateral shape so as to surround the image sensor 132. There are corners in the adhesive 303 formed in the quadrilateral shape. The amount of the adhesive at the corner portion tends to be larger than that at a side portion.

A diagram in which the portion having a large amount of the adhesive 303 is denoted by a circle is illustrated in B of FIG. 7. On the frame 134, the vent 302 is provided at a portion corresponding to the portion denoted by the circle. When the vent 302 is provided at the portion having a large amount of the adhesive 303, the vent 302 can be reliably blocked by the adhesive 303.

Therefore, the vent 302 can be configured to be provided at the corner portion having a large application amount of the adhesive 303. In addition, a plurality of the vents 302 can be provided. It is also possible to employ a structure in which a plurality of portions is selected from among the plurality of portions denoted by the circles in B of FIG. 7, and the vents 302 are provided in the frame 134. Needless to say, it is possible to employ a structure in which only the single vent 302 is provided. Alternatively, the vent 302 can be provided at a straight portion that is not at the corner.

<Regarding Shape of Vent>

The shape of the vent 302 will be described with reference to FIG. 8.

Figure 8:
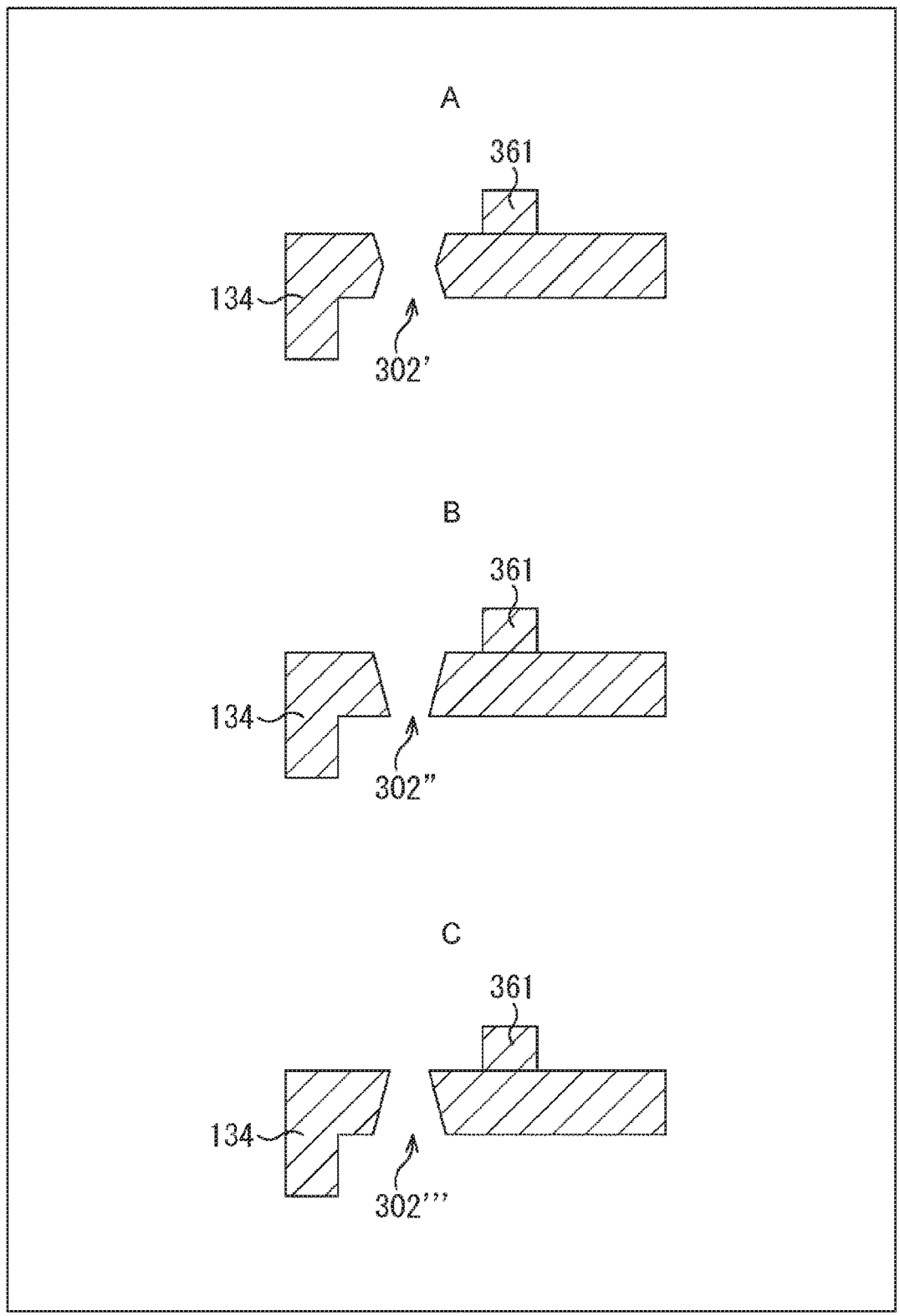
FIG. 8 is a diagram for explaining a shape of the vent.

A vent 302' illustrated in A of FIG. 8 has a shape tapered in the upward direction and the downward direction. The vent 302' is formed so that a central portion is narrow and an upper side (side close to the upper part 111) and a lower side (side close to the image sensor 132) are wide. The vent 302' is shaped like combined two cones.

Since the vent 302' is tapered, a mold can be prevented from being unable to be pulled out when the vent 302' is formed. When the vent 302' illustrated in A of FIG. 8 is formed, a mold (pin-shaped metal part) is inserted from the lower side, whereby the lower side below the center of the vent 302' is formed. A mold is inserted from the upper side, whereby the upper side above the center of the vent 302' is formed. During this formation, the mold can be prevented from being unable to be pulled out since the shape of the vent 302' is tapered.

B of FIG. 8 a diagram illustrating another shape of the vent 302. A vent 302" illustrated in B of FIG. 8 also has a tapered shape. The vent 302" is formed so that an upper side (side close to the upper part 111) is wide and a lower side (side close to the image sensor 132) is narrow. When the vent 302" illustrated in B of FIG. 8 is formed, a mold (pin-shaped metal part) is inserted from the upper side, whereby the vent 302" is formed.

C of FIG. 8 is a diagram illustrating another shape of the vent 30. A vent 302''' illustrated in B of FIG. 8 also has a tapered shape. The vent 302''' is formed so that an upper side (side close to the upper part 111) is narrow and a lower side (side close to the image sensor 132) is wide. When the vent 302''' illustrated in C of FIG. 8 is formed, a mold (pin-shaped metal part) is inserted from the lower side, whereby the vent 302''' is formed.

In this manner, since the vent 302 is tapered, the mold can be prevented from being unable to be pulled out at the time of the manufacture as described above. Note that a structure without the taper can be employed in a case where the mold can be pulled out without any problem.

In addition, in a case where a side of the vent 302 on which the adhesive 303 is applied is formed to have a wide bore, the adhesive 303 readily enters the vent 302 when the vent 302 is blocked by the adhesive 303 (FIG. 6). Moreover, in a case where a side opposite to the side of the vent 302 on which the adhesive 303 is applied is formed to have a narrow bore, the adhesive 303 can be prevented from falling onto the substrate 131 when the vent 302 is blocked by the adhesive 303 (FIG. 6).

In other words, the vent 302 can be tapered to be formed in such a shape as to enable the vent 302 to be readily filled with the adhesive 303 and to hardly leak the adhesive 303 when the vent 302 is blocked by the adhesive 303.

The vent 302 configured in this manner can be a circle having a size of, for example, 0.2 mm or less. If the diameter of the vent 302 is large, the vent 302 is not likely to be fully blocked by the adhesive 303. On the other hand, if the diameter of the vent 302 is small, it is difficult to discharge thermally expanded air, and an influence of the thermally expanded air is likely to be exerted. In this regard, the size of the vent 302 and the number of vents 302 are decided in accordance with, for example, the strength of the mold that is used for forming the vent 302.

For example, as described above, the vent 302 can be a circle of 0.2 mm or less, or a circle of 0.1 to 0.2 mm. In a case where the vent 302 is tapered, the wide side may be formed to have a diameter of 0.2 mm, and the narrow side may be formed to have a diameter of 0.1 mm, <Regarding Configuration in which Light Shielding Wall is Provided>

Figure 9:
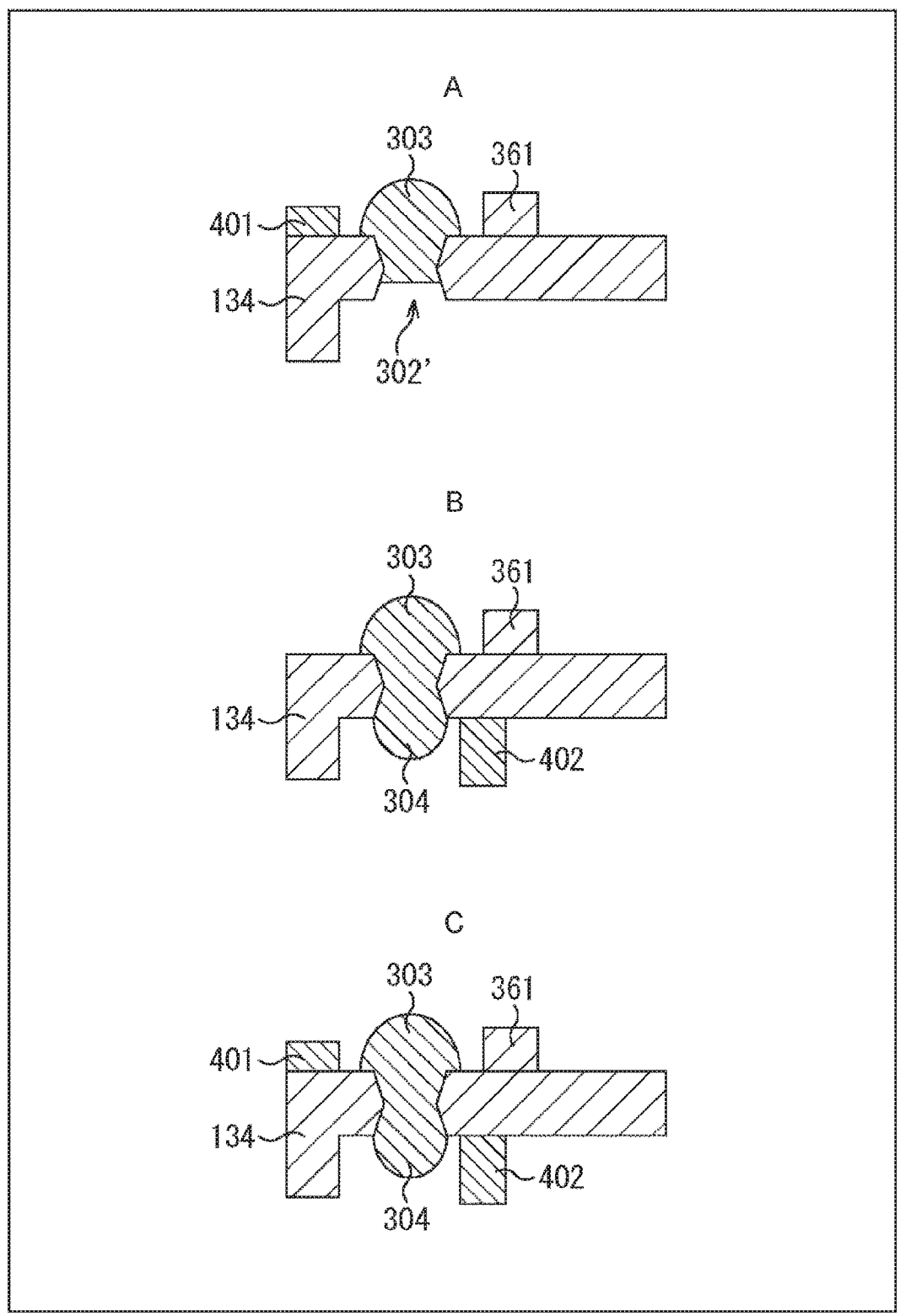
FIG. 9 is a diagram for explaining a configuration in which a light shielding wail is provided.

Next, a case in which the light shielding wall is provided on the frame 134 will be described. A of FIG. 9 is an example of providing a light shielding wall 401 on an upper side of the frame 134. As illustrated in A of FIG. 9, the light shielding wall 401 can be configured to be provided on a side wall side on the surface of the frame 134 to which the upper part 111 is bonded.

Since the lights shielding wail 401 is provided, the image sensor 132 can be shielded from light that passes through the adhesive 303 and reaches the image sensor 132, and flare can be prevented. In addition, the adhesive 303 can be prevented from leaking to the side wall side of the frame 134.

B of FIG. 9 is an example of providing a light shielding wall 402 on a lower side of the frame 134. As illustrated in B of FIG. 9, the light shielding wall 402 can be configured to be provided on a side provided with the IRCF 133 (FIG. 6) on the surface of the frame 134 close to the imaging device 131 (FIG. 6).

Since the light shielding wall 402 is provided, the image sensor 132 can be shielded from light that passes through the adhesive 303 and reaches the image sensor 132, and flare can be prevented. In addition, the adhesive 303 can be prevented from leaking to the side of the frame 134 close to the IRCF 133.

C of FIG. 9 is an example of providing the light shielding wall 401 on the upper side of the frame 134, and providing the light shielding wall 402 on the lower side. As illustrated in C of FIG. 9, the light shielding walls may be provided on the upper and lower sides of the frame 134. In this case as well, as described with reference to A of FIG. 9 and B of FIG. 9, since the light shielding walls 401 and 402 are provided, the image sensor 132 can be shielded from light that passes through the adhesive 303 and reaches the image sensor 132, and flare can be prevented. In addition, the adhesive 303 can be prevented from leaking to the side wall side of the frame 134 and the side of the frame 134 close to the IRCF 133.

The description has been provided so far using the case of forming the light shielding wall on the frame 134 as an example. Alternatively, the adhesive 303 itself may be a light shielding resin. The light shielding resin is a resin having a function as the adhesive for bonding the upper part 111 and the lower part 112 together, and having a light shielding function. For example, the light shielding resin is a black resin containing carbon.

Even in the configuration that uses the light shielding resin as the adhesive 303, the light shielding wall 401 and the light shielding wall 402 can be configured to be provided, thereby achieving the configuration in which the stray light component does not enter the image sensor 132.

An ultraviolet (UV) curable resin may be used as the light shielding resin. The ultraviolet curable resin is a resin that is polymerized and cured in a short time by ultraviolet energy radiated from an ultraviolet irradiation device. Such an ultraviolet curable resin can be used as the adhesive 303.

In addition, a resin that is cured by ultraviolet rays and heat may be used as the light shielding resin As described later, an outer side of the adhesive 303 is temporarily cured by the ultraviolet rays, and an inner side is fully cured by the heat, whereby an air path (passage extending from the space 135 to the outside of the space 135) can be prevented from being formed in the adhesive 303.

<Regarding Shape of Leg>

The shape of the leg 351 to be employed in a case where the leg 351 is provided on the upper part 111 will be described with reference to FIGS. 10 to 14.

Figure 10:
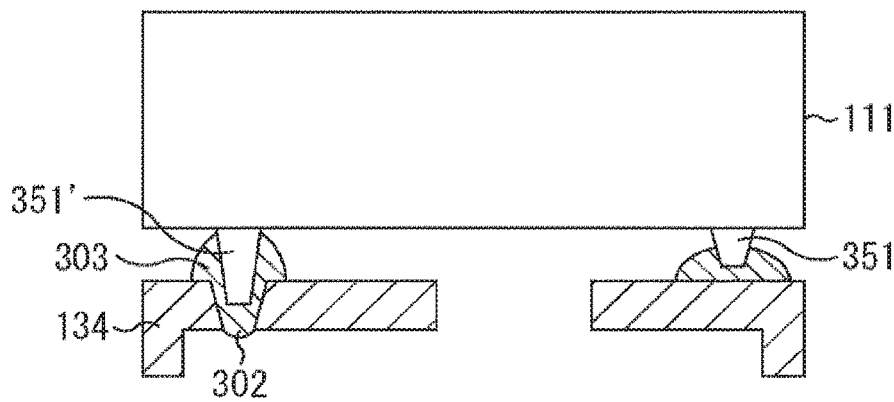
FIG. 10 is a diagram for explaining a shape of a leg.

FIG. 10 is a diagram illustrating an exemplary shape of the leg 351. A leg 351' illustrated in FIG. 10 has such a shape as to come halfway into the vent 302. In this manner, since the leg 351' has such a shape as to come halfway into the vent 302, the vent 302 can be readily blocked.

Note that, as described with reference to FIG. 7, the leg 351 is annularly provided, and provided to further strengthen the bond to the adhesive 303. The leg 351' is provided in such a manner that only a portion of the leg 351 at which the vent 302 is located is longer and more protruding than the other portion of the leg 351 so as to be positioned halfway in the vent 302.

For example, as illustrated in FIG. 10, comparing the leg 351 (right side in FIG. 10) and the leg 351' (left side in FIG. 10), the leg 351' is configured to be longer than the leg 351. Since the leg 351' is the leg 351 located at the position where the vent 302 exists, the leg 351' is formed longer than the other leg 351. Due to this reason, the leg 351' is provided like a protrusion having a projecting shape with respect to the leg 351.

Since the leg 351' is shaped to be inserted halfway into the vent 302, even though, for example, the application amount of the adhesive 303 is the same as the application amount in a place other than the vent 302, the adhesive 303 is pushed out to the vent 302 by the leg 351' when the upper part 111 is bonded to the lower part 112, and the vent 302 can be blocked more reliably.

Instead of providing the protruding portion (leg 351') on the annularly-provided leg 351, a projecting part may be provided on a side close to the vent 302. A configuration in which a projecting part 421 is provided on a portion at the vent 302 is illustrated in FIG. 11.

Figure 11:
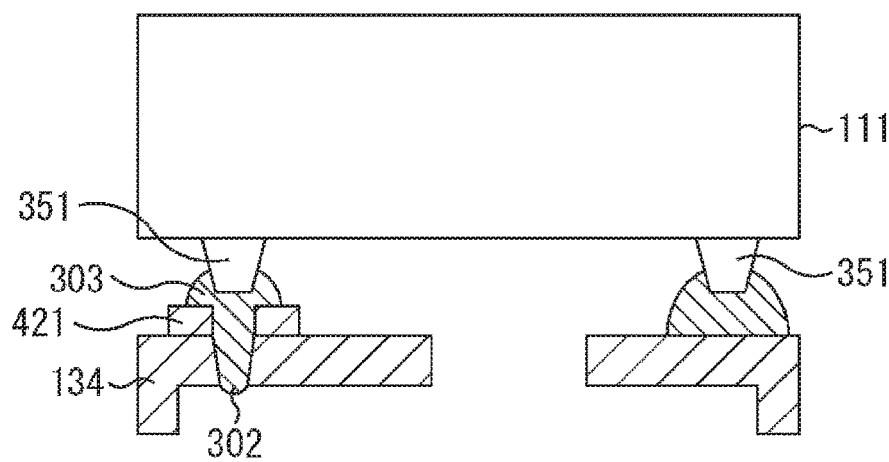
FIG. 11 is a diagram for explaining a shape of the leg.

As illustrated in FIG. 11, the projecting part 421 is provided at the portion where the vent 302 is located on the surface of the frame 134 close to the upper part 111. The projecting part 421 has such a shape that a central portion is connected to the vent 302, and the central portion has a hole.

When the adhesive 303 is applied onto this projecting part 421, and the leg 351 is pressed on the adhesive 303, the adhesive 303 is pushed out to the hole provided in the central portion of the projecting part 421, and further pushed out to the vent 302 connected to the hole. Consequently, the vent 302 can be blocked by the adhesive 303 more reliably.

As described above, the portion of the frame 14 at which the vent 302 is provided can be configured to be formed higher than the portion at which the vent 302 is not provided, and the projecting part 421 can be configured to be provided at the position close to the leg 351.

Figure 12:
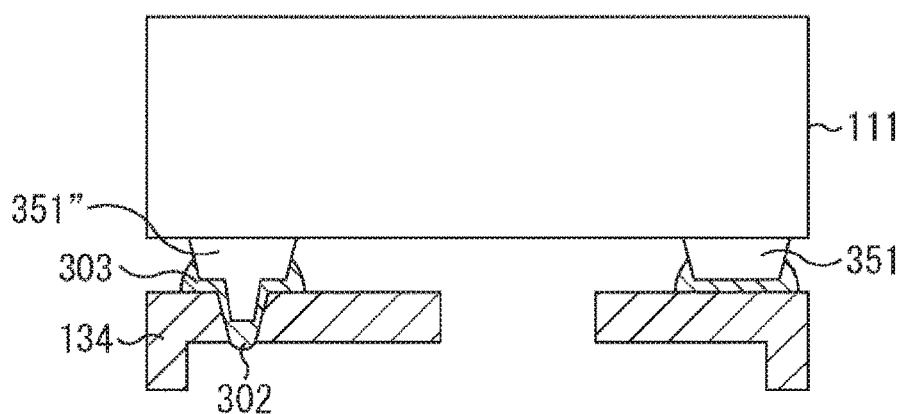
FIG. 12 is a diagram for explaining a shape of the leg.

FIG. 12 is a diagram for explaining another shape of the leg 351. A leg 351" illustrated in FIG. 12 has a shape including a rib (bank). As illustrated in FIG. 12, the leg 351" at the portion where the vent 302 is located is shaped in such a manner that the rib is provided on the leg 351 at the portion where the vent 302 is not located. The rib portion of the leg 351" has such a shape as to conic into the vent 302.

The upper part 111 having the leg 351" illustrated in FIG. 12 can be applied to a single focus camera and a camera without optical correction (the above-mentioned lens movement correction is not performed). In addition, since the leg 351" having the rib is used, when the upper part 111 and the lower part 112 are bonded together in an abutting manner without the optical correction (without the lens movement correction), the upper part 111 can be guided to an accurate position for the bond to the lower part 112. Specifically, the upper part 111 is moved so that the rib is positioned in the vent 302, whereby the upper part 111 can be guided to the accurate position for the bond to the lower part 112.

The leg 351 described with reference to FIGS. 10 to 12 is based on the premise that a central axis of the leg 351 and a central axis of the vent 301 are substantially the same. Next, the leg 351 shaped in such a manner that the central axis of the leg 351 and the central axis of the vent 301 are displaced from each other will be described with reference to FIG. 13.

Figure 13:
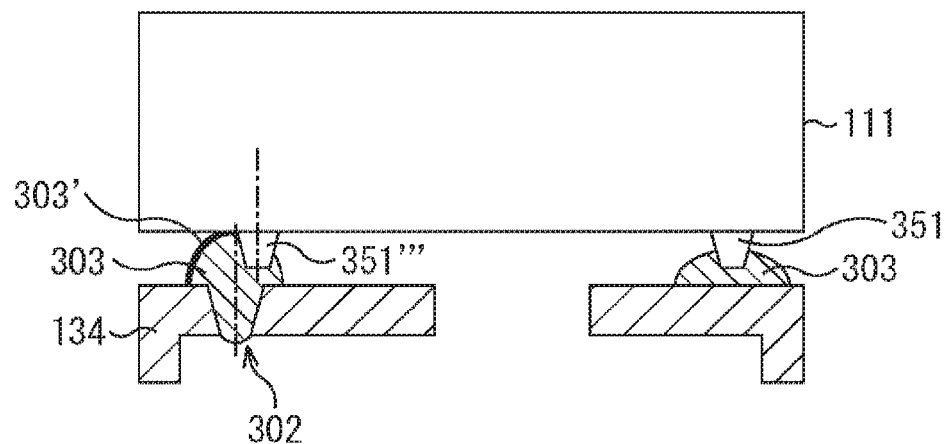
FIG. 13 is a diagram for explaining a shape of the leg.

A central axis of a leg 351''' illustrated in FIG. 13 and the central axis of the vent 302 are located at displaced positions. In FIG. 13, the central axis is represented by a dashed-dotted line. The central axis of the leg 351''' is located inside the central axis of the vent 302 (on a side close to the IRCF 133).

In this manner, since the central axis of the leg 351''' and the central axis of the vent 302 are displaced from each other, even if air in the space 135 is thermally expanded after the vent 302 is blocked by the adhesive 303, and force is applied from the space 135 to the vent 302, it is possible to prevent the space 135 from being connected to the outside of the space 135 through a hole that is made in the adhesive 303 due to the force. In other words, the formation of the air path can be prevented.

In a case where the ultraviolet curable resin is used as the adhesive 303, the outer side of the adhesive 303 becomes cured. In FIG. 13, a cured portion of the adhesive 303 is represented by a thick line and denoted as an adhesive 303'.

Owing to the presence of the cured adhesive 303', even if the air path is generated, the air path can be stopped by the cured adhesive 303'. Consequently, it is possible to prevent the space 135 from being connected to the outside of the space 135 by the air path.

In this manner, the central axis of the leg 351''' and the central axis of the vent 302 may be configured to be displaced from each other. In addition, the ultraviolet curable resin may provide a mechanism for curing (temporarily curing) the outer side of the adhesive 303 in advance of the inner side.

Figure 14:
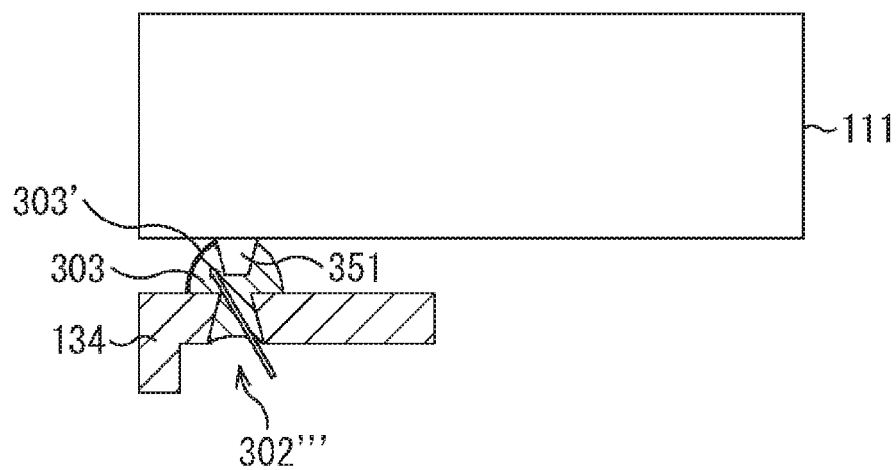
FIG. 14 is a diagram for explaining a shape of the leg.

FIG. 14 is a diagram illustrating another configuration of the leg 351 and the vent 302 configured in such a manner that the ultraviolet curable resin is used as the adhesive 303 and temporarily cured to prevent the generation of the air path. The vent 302 is formed in the tapered shape having the wide lower side and the narrow upper side. In addition, in the same way as the adhesive 303 illustrated in FIG. 13, the ultraviolet curable resin is used as the adhesive 303, and the outer side of the adhesive 303 is configured to be temporarily cured.

Owing to this configuration, even in the occurrence of a situation where the air path is likely to be generated since air in the space 135 is thermally expanded and the adhesive 303 is pushed up as illustrated by an arrow in FIG. 14, the air path is stopped by the temporarily cured adhesive 303' and can be prevented from being connected to the outside.

Moreover, since the taper is formed downward, the amount of the adhesive 303 on the lower side of the vent 302 is increased. Therefore, even if the adhesive 303 is pushed up by the thermally expanded air, the push-up force is reduced, and the adhesive 303 can be prevented from being further pushed away.

In this manner, the generation of the air path can be prevented owing to the shape of the vent 302 and the material for the adhesive 303.

In the above-mentioned embodiment, the example of blocking the vent 302 by means of the adhesive 303 has been described. Alternatively, the vent 302 may be blocked by the leg 351, not by the adhesive 303.

For example, in a case where the leg 351 is configured to enter the vent 302 as described with reference to FIGS. 10 and 12, the vent 302 may be blocked by the leg 351. According to the present technology, the leg 351 and the vent 302 can be formed in such a size and shape as to enable the leg 351 to block the vent 302.

In a case where the vent 302 is configured to be blocked by the leg 351, in the same way as in the above-mentioned embodiment, the vent 302 can be blocked when the upper part 111 is bonded to the lower part 112. Therefore, the vent 302 can be blocked without an increase in the number of steps.

According to the present technology, when the vent that is required in the steps is blocked for the improvement in the reliability, the vent can be filled with the resin in the latter step so that the blocking step is not added later. Consequently, the blocking step can be reduced, and the effect of a reduction in processing costs can be expected.

<Regarding Manufacture>

Figure 15:
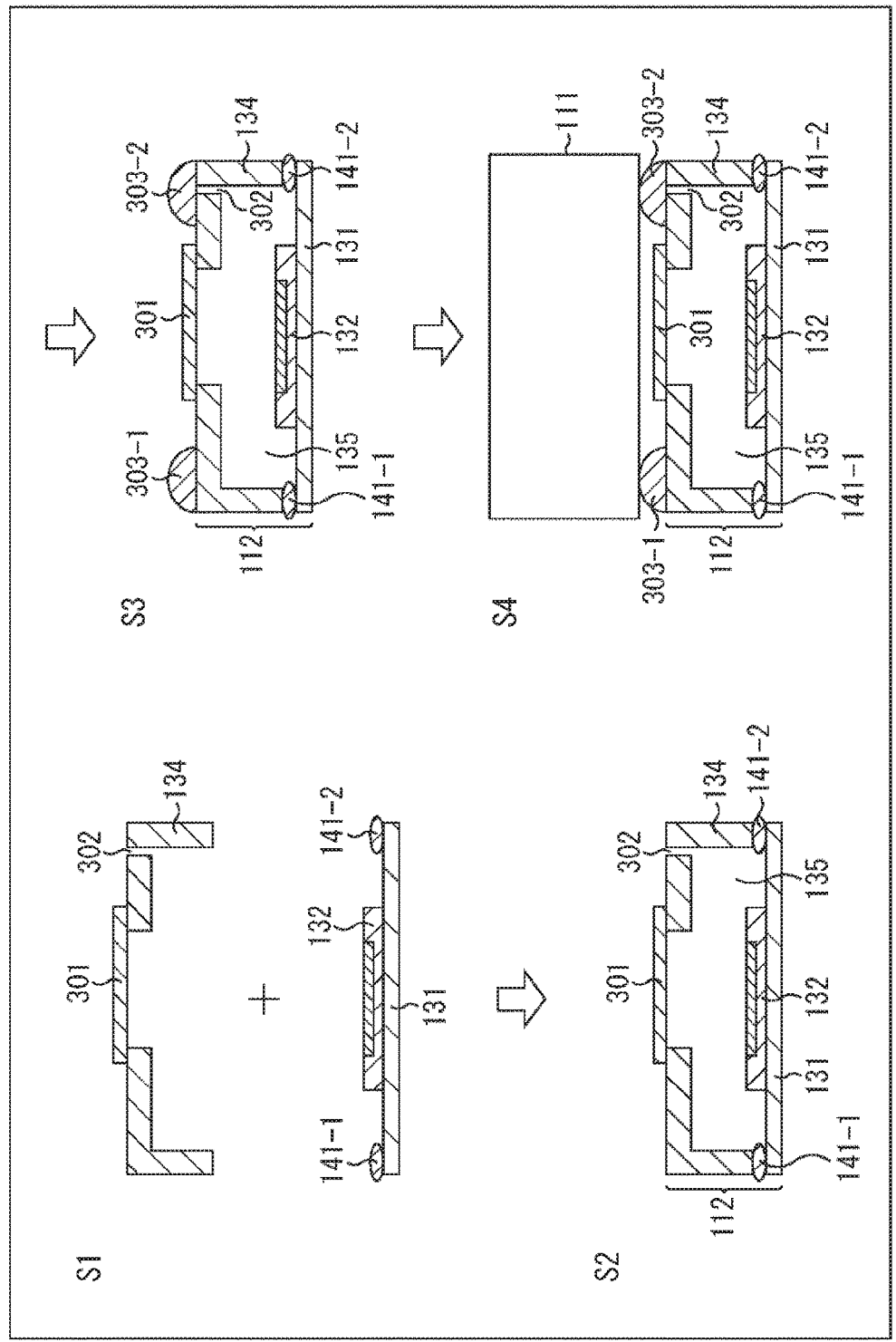
FIG. 15 is a diagram for explaining the manufacturing steps for the imaging device.

Next, the manufacturing steps for the above-mentioned imaging device will be described with reference to FIG. 15. The description that is provided with reference to FIG. 15 is the description of the manufacture of the imaging device 300 illustrated in FIG. 5. However, the imaging devices including other configurations can also be manufactured in similar steps.

In step S1, the lower part 112 is manufactured. The IRCF 301 is fixed to the frame 134. The IRCF 301 may be fixed to the frame 134 by an adhesive, or may be fixed in such a manner that a cut is made in the frame 134, and the IRCF 301 is fixed in the cut.

In addition, the frame 134 is provided with the vent 302. The vent 302 is shaped, for example, as described with reference to FIGS. 8A to 14.

The image sensor 132 is attached onto the substrate 131, and the wiring or the like is also installed. The adhesive 141 is applied onto this substrate 131. The adhesive 141 is annularly applied, and the frame 134 is placed on this adhesive 141, whereby the substrate 131 and the frame 134 are bonded together.

In step S2, thermally expanded air is discharged through the vent 302. In a case where the thermosetting resin is used as the adhesive 141, air in the space 135 is also heated when the substrate 131 and the frame 134 are bonded together, and likely to be thermally expanded. The thermally expanded air is discharged to the outside of the frame 134 through the vent 302.

In step S3, the adhesive 303 for bonding the upper part 111 is applied onto the frame 134. The application of the adhesive 303 means that the adhesive 303 is applied onto the vent 302 as well, and the vent 302 is blocked. In other words, the adhesive 303 is applied to a region including the portion of the frame 134 at which the vent 302 is provided. The vent 302 is blocked.

Note that the adhesive 141 that bonds the substrate 131 and the frame 134 together and the adhesive 303 that bonds the frame 134 and the upper part 111 together may be members made of different materials, or may be the same member.

In step S4, the upper part 111 is placed on the applied adhesive 303, and bonded to the lower part 112. As described above, the upper part 111 is provided with the leg 351, and the vent 302 is formed in the tapered shape. Consequently, the adhesive 303 can be pushed into the vent 302 to block the vent 302 more reliably, and the generation of the air path can be prevented.

The imaging device 300 is manufactured in this manner. A step only for blocking the vent 302 is not included, and the vent 302 is blocked when the upper part 111 is bonded to the lower part 112. Therefore, even though a new step only for blocking the vent 302 is not added, the vent 302 can be blocked, the thermally expanded air can be discharged to the outside, and the vent 302 can be blocked after that.

According to the present technology, when the vent that is required in the steps is blocked for the improvement in the reliability, the vent can be filled with the resin in the latter step so that the blocking step is not added later. Consequently, the blocking step can be reduced, and the effect of the reduction in the processing costs can be expected.

<Electronic Apparatus>

The present technology is not limited to the application to the imaging device, and can be generally applied to an electronic apparatus in which an imaging device is used for an image taking unit (photoelectric conversion unit). Examples of the electronic apparatus include an imaging device such as a digital still camera and a video camera, a mobile terminal device having an imaging function such as a mobile phone, and a copier in which an imaging device is used for an image reading unit. Note that a modular form mounted on the electronic apparatus, that is, a camera module, may serve as the imaging device.

Figure 16:
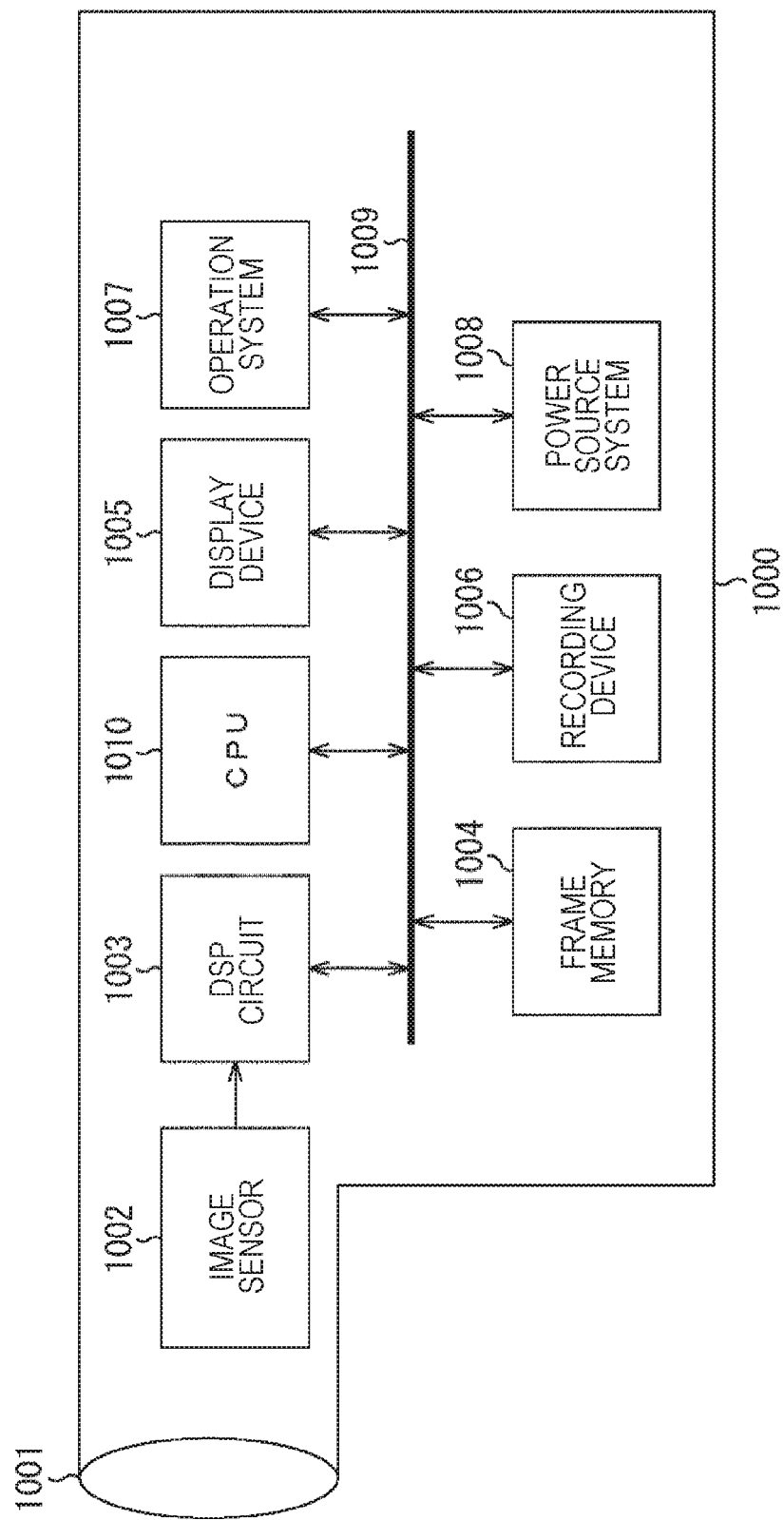
FIG. 16 is a diagram for explaining a configuration of an electronic apparatus.

FIG. 16 is a block diagram illustrating an exemplary configuration of the imaging device that is an example of the electronic apparatus of the present disclosure. As illustrated in FIG. 16, the imaging device 1000 of the present disclosure has, for example, an optical system including a lens group 1001 or the like, an image sensor 1002, a DSP circuit 1003 that is a camera signal processing unit, a frame memory 1004, a display device 1005, a recording device 1006, an operation system 1007, and a power source system 1008.

Moreover, the DSP circuit 1003, the frame memory 1004, the display device 1005, the recording device 1006, the operation system 1007, and the power source system 1008 are configured to be coupled to one another via a bus line 1009. A CPU 1010 controls each component in the imaging device 1000.

The lens group 1001 obtains incident light (image light) from an object, and forms an image on an imaging surface of the image sensor 1002. The image sensor 1002 converts, into an electric signal on a pixel basis, the quantity of light of the incident light from which the image has been formed on the imaging surface by the lens group 1001. The image sensor 1002 then outputs the electric signal as a pixel signal. The solid state image sensor according to the aforementioned embodiment can be used as the image sensor 1002.

The display device 1005 includes a panel type display device such as a liquid crystal display device and an organic electro luminescence (EL) display device. The display device 1005 displays a moving image or a still image captured by the image sensor 1002. The recording device 1006 records the moving image or the still image captured by the image sensor 1002 in a recording medium such as a videotape and a digital versatile disk (DVD).

The operation system 1007 gives operation instructions about various functions of the present imaging device under the control of a user. The power source system 1008 appropriately supplies, to supply targets, various power sources that serve as operation power sources for the supply targets, namely, the DSP circuit 1003, the frame memory 1004, the display device 1005, the recording device 1006, and the operation system 1007.

The above-mentioned imaging device 1000 is applied to a video camera or a digital still camera, and a camera module for a mobile apparatus such as a mobile phone. In addition, is the imaging device 1000, for example, the imaging device 300 according to the aforementioned embodiment can be used as the lens group 1001 and the image sensor 1002.

Note that the effects described in the present description are only examples, and are not limited to these effects. Other effects may also be obtained.

Note that the embodiment of the present technology is not limited to the above-mentioned embodiment, and can be variously changed in a range not departing from the gist of the present technology.

Note that the present technology can also be configured as follows.

(1) An imaging device including:
a substrate on which an image sensor is mounted;
a frame that fixes an infrared cut filter (IRCF); and
a unit including a lens, wherein
the image sensor is sealed by the substrate, the IRCF, and the frame,
a vent connected to a space in which the image sensor is sealed is provided in a part of the frame, and
the vent is blocked by a member that bonds the unit and the frame together.

(2) The imaging device according to (1), wherein
the vent is provided in the frame, in a predetermined shape, and in a vertical direction with respect to a surface to which the member is applied.

(3) The imaging device according to (1) or (2), wherein
the vent has a tapered shape.

(4) The imaging device according to any of (1) to (3), wherein
the unit has a leg that is inserted into the member, and the vent is provided on the frame corresponding to a position right under the leg.

(5) The imaging device according to any of (1) to (4), wherein
the member is annularly applied onto the frame, and
the vent is provided on the frame corresponding to a bent portion or a straight portion of the member.

(6) The imaging device according to any of (1) to (5), wherein
the frame has a light shielding wall in the vicinity of a position of the vent.

(7) The imaging device according to any of (1) to (6), wherein
the member is a light shielding resin.

(8) The imaging device according to (4), wherein
the leg is inserted halfway into the vent.

(9) The imaging device according to any of (1) to (8), wherein
a portion of the frame at which the vent is located is configured to have a projecting shape so as to come closer to the unit than a portion at which the vent is not located does.

(10) The imaging device according to (4), wherein
a portion of the leg that is inserted into the member at which the vent is located has a rib, and
the unit is bonded to the frame in an abutting manner such that the rib is inserted into the vent.

(11) The imaging device according to (4), wherein
a central axis of the leg and a central axis of the vent are displaced from each other.

(12) The imaging device according to any of (1) to (11), wherein
the member includes an ultraviolet curable resin or a resin that is cured by ultraviolet rays and heat.

(13) The imaging device according to any of (1) to (12), wherein
the vent has a diameter of 0.2 mm or less.

(14) The imaging device according to (4), wherein
the vent is blocked by the leg.

(15) An imaging device including:
a substrate on which an image sensor is mounted;
a frame that fixes an infrared cut filter (IRCF); and
a unit including a lens, wherein
the image sensor is sealed by the substrate, the IRCF, and the frame,
a vent connected to a space in which the image sensor is sealed is provided between the frame and the IRCF, and
the vent is blocked by a member that bonds the unit and the frame together.

(16) The imaging device according to (15), wherein
the IRCF is configured to be large in a direction toward a position of the vent.

(17) The imaging device according to (15), wherein
the member at a portion where the vent exists is applied more than the member at a portion where the vent does not exist.

(18) A manufacturing device that manufactures an imaging device, the imaging device including:
a substrate on which an image sensor is mounted;
a frame that fixes an infrared cut filter (IRCF); and
a unit bonded to the frame and including a lens, wherein
the image sensor is sealed by the substrate, the IRCF, and the frame,
a vent connected to a space in which the image sensor is sealed is provided in a part of the frame, and
the vent is blocked by a member that bonds the unit and the frame together.

(19) A manufacturing device configured to, when a substrate on which an image sensor is mounted, a frame to which an infrared cut filter (IRCF) is fixed, and a unit including a lens are bonded together:
  apply, onto the substrate, a first member for bonding the frame;
  bond the frame to the substrate using the first member applied onto the substrate;
  after thermally expanded air is discharged through a vent having a predetermined shape and provided in the frame, apply a second member to a portion including the vent; and
  bond the frame and the unit together such that the portion to which the second member has been applied and a part of the unit are bonded together in an abutting manner or spatially.

(20) A manufacturing method including the steps of, when a substrate on which an image sensor is mounted, a frame to which an infrared cut filter (IRCF) is fixed, and a unit including a lens are bonded together:
  applying, onto the substrate, a first member for bonding the frame;
  bonding the frame to the substrate using the first member applied onto the substrate;
  after thermally expanded air is discharged through a vent having a predetermined shape and provided in the frame, applying a second member to a portion including the vent; and
  bonding the frame and the unit together such that the portion to which the second member has been applied and a part of the unit are bonded together in an abutting manner or spatially.

REFERENCE SIGNS LIST

111 Upper part
112 Lower part
131 Substrate
132 Image sensor
134 Frame
141 Adhesive
300 Imaging device
301 IRCF
302 Vent
303 Adhesive
351 Leg

What is claimed is:

1. An imaging device comprising:
  a substrate on which an image sensor is mounted;
  a frame connected to the substrate;
  a unit connected to the frame, the unit holding a lens that has an optical axis and that receives incident light; and
  an infrared cut filter (IRCF) disposed between the image sensor and the lens,
    wherein the IRCF is configured to cut an infrared light component of the incident light,
    wherein the unit has a protrusion extending in a direction of the optical axis,
    wherein the image sensor is disposed in a space formed at least in part by the substrate, the IRCF, and the frame,
    wherein the frame has an opening,
    wherein a gap between the opening in the frame and the protrusion of the unit is filled by an adhesive member, and
    wherein the opening is filled by the adhesive member.

2. The imaging device according to claim 1, wherein the protrusion is inserted halfway into the opening.

3. The imaging device according to claim 1, wherein the opening has a tapered shape.

4. The imaging device according to claim 1, wherein the adhesive member is annularly applied onto the frame.

5. The imaging device according to claim 1, wherein the frame has a plurality of openings.

6. The imaging device according to claim 1, wherein the unit has a plurality of protrusions.

7. The imaging device according to claim 1, wherein a light shielding wall extended to the direction of the optical axis is disposed between the protrusion and the IRCF.

8. The imaging device according to claim 7, wherein the frame has the light shielding wall.

9. The imaging device according to claim 1, wherein the adhesive member is a light shielding resin.

10. The imaging device according to claim 1, wherein the adhesive member is an ultraviolet curable resin or a resin that is cured by ultraviolet rays and heat.

11. The imaging device according to claim 1, wherein the opening has a diameter of 0.2 mm or less.

12. The imaging device according to claim 1, wherein IRCF is held by the frame.

13. An imaging device comprising:
  a substrate on which an image sensor is mounted;
  a frame connected to the substrate;
  a unit connected to the frame, the unit holding a lens that has an optical axis and that receives incident light; and
  an infrared cut filter (IRCF) disposed between the image sensor and the lens,
    wherein the IRCF is configured to cut an infrared light component of the incident light,
    wherein the unit has a protrusion extending in a direction of the optical axis,
    wherein the image sensor is disposed in a space formed at least in part by the substrate, the IRCF, and the frame when the unit is connected to the frame,
    wherein the frame has an opening,
    wherein a gap between the opening in the frame and the protrusion of the unit is filled by an adhesive member, and
    wherein a light shielding wall extending in the direction of the optical axis is disposed between the protrusion and the IRCF.

14. The imaging device according to claim 13, wherein the opening has a tapered shape.

15. The imaging device according to claim 13, wherein the adhesive member is annularly applied onto the frame.

16. The imaging device according to claim 13, wherein the unit has a plurality of protrusions.

17. The imaging device according to claim 13, wherein the frame has the light shielding wall.

18. The imaging device according to claim 13, wherein the adhesive member is an ultraviolet curable resin or a resin that is cured by ultraviolet rays and heat.

19. The imaging device according to claim 13, wherein the IRCF is held by the frame.

20. A manufacturing method comprising:
  disposing an image sensor on a substrate,
  connecting a frame to the substrate;
  connecting a lens to a unit, the lens having an optical axis and receiving incident light;
  disposing an infrared cut filter (IRCF) between the image sensor and the lens, wherein the IRCF is configured to cut an infrared light component of the incident light, wherein the unit has a protrusion extending in a direction of the optical axis, wherein the image sensor is in a space formed by the substrate, the IRCF, and the frame, and wherein the frame has an opening before the unit is connected to the frame;

inserting the protrusion into the opening;

filling the opening using an adhesive member and the protrusion; and filling a gap between the frame and the unit using the adhesive member.

\* \* \* \* \*